United States Patent
Paul et al.

(10) Patent No.: US 10,121,713 B1
(45) Date of Patent: Nov. 6, 2018

(54) IN-KERF TEST STRUCTURE AND TESTING METHOD FOR A MEMORY ARRAY

(71) Applicant: GLOBALFOUNDRIES INC., Grand Cayman (KY)

(72) Inventors: Bipul C. Paul, Mechanicville, NY (US); Hajime Terazawa, Malta, NY (US); Joseph Versaggi, Galway, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/589,126

(22) Filed: May 8, 2017

(51) Int. Cl.
| | |
|---|---|
| H01L 21/66 | (2006.01) |
| H01L 27/11 | (2006.01) |
| G01R 31/00 | (2006.01) |
| G01R 31/28 | (2006.01) |

(52) U.S. Cl.
CPC .............. *H01L 22/34* (2013.01); *H01L 22/14* (2013.01); *H01L 27/1104* (2013.01); *G01R 31/00* (2013.01); *G01R 31/2856* (2013.01)

(58) Field of Classification Search
CPC ......... H01L 22/14; H01L 22/32; H01L 22/34; H01L 27/1104; G01R 31/00; G01R 31/2856
See application file for complete search history.

(56) References Cited

U.S. PATENT DOCUMENTS

| | | | |
|---|---|---|---|
| 7,385,864 B2 | 6/2008 | Loh et al. | |
| 7,408,372 B2 | 8/2008 | Agarwal et al. | |
| 7,936,623 B2 | 5/2011 | Deng et al. | |
| 9,046,573 B1 | 6/2015 | Watt | |
| 2001/0022360 A1* | 9/2001 | Richter | .................... H01L 22/34 257/48 |
| 2003/0094608 A1* | 5/2003 | Abadeer | ................. H01L 22/34 257/48 |
| 2004/0061112 A1* | 4/2004 | Felber | ..................... H01L 22/34 257/48 |
| 2005/0051765 A1* | 3/2005 | Rosskopf | ............... G11C 29/50 257/12 |
| 2006/0138411 A1* | 6/2006 | Lachenmann | .......... H01L 22/34 257/48 |
| 2007/0082417 A1* | 4/2007 | Martin | .................... H01L 22/12 438/14 |
| 2008/0144421 A1 | 6/2008 | Deng et al. | |

(Continued)

*Primary Examiner* — Mohsen Ahmadi
(74) *Attorney, Agent, or Firm* — Gibb & Riley, LLC; Michael J. LeStrange, Esq.

(57) ABSTRACT

Disclosed are an in-kerf test structure and testing method for testing an on-chip device. The structure includes at least one test component with at least one test device and adjoining dummy devices connected to the test device. Each adjoining dummy device has proximal node(s) directly connected to a test device and distal node(s) that are not directly connected to a test device. The nodes of each test device and the distal nodes of each adjoining dummy device are connected to input/output pads. During testing the input/output pads are used to bias the nodes of a selected test device as well as the distal node(s) of any adjoining dummy device. By biasing the distal node(s) of an adjoining dummy device, random accumulation of potential thereon is avoided and current contributions from the adjoining dummy device(s) to a current measurement taken from the selected test device can be accurately determined.

7 Claims, 13 Drawing Sheets

(56) References Cited

U.S. PATENT DOCUMENTS

| | | |
|---|---|---|
| 2008/0273403 A1 | 11/2008 | Ehrenreich et al. |
| 2009/0243645 A1 | 10/2009 | Shinkawata |
| 2013/0094315 A1* | 4/2013 | Patterson ......... G11C 29/50008 |
| | | 365/201 |
| 2014/0027772 A1* | 1/2014 | Zundel .................... H01L 21/78 |
| | | 257/48 |
| 2014/0188265 A1 | 7/2014 | Bickford et al. |

* cited by examiner

| PAD# | Test Component | Node(s) |
|---|---|---|
| 1 | 1st Test Component | PG Section: PG-R Drain |
| 2 | 1st Test Component | PG Section PG-L&R Gate AND PD Section PG L&R Gate |
| 3 | 1st Test Component | PG Section PG-L&R Source |
| 4 | 1st Test Component | PG Section PG-L Drain |
| 5 | 1st Test Component | PD Section PD-L Drain |
| 6 | 1st Test Component | PD Section PD-L&R Source |
| 7 | 1st Test Component | PD Section PD-R Drain |
| 8 | 1st Test Component | PU Section PU-L Source |
| 9 | 1st Test Component | PU Section PU-L&R Drain |
| 10 | 1st Test Component | PU Section PU-L&R Gate |
| 11 | 1st Test Component | PU Section PU-R Source |
| 12 | 2nd Test Component | VSS |
| 13 | 2nd Test Component | WL |
| 14 | 2nd Test Component | SN-L |
| 15 | 2nd Test Component | BL-L |
| 16 | 2nd Test Component | BL-R |
| 17 | 2nd Test Component | SN-R |
| 18 | 2nd Test Component | VDD |
| 19 | Common | NW/VDD |
| 20 | 3rd Test Component | PW |
| 21 | 3rd Test Component | VSS |
| 22 | 3rd Test Component | BL-R |
| 23 | 3rd Test Component | BL-L |
| 24 | 3rd Test Component | WL |
| 25 | All | PW/PSUB (not shown) |

FIG. 3

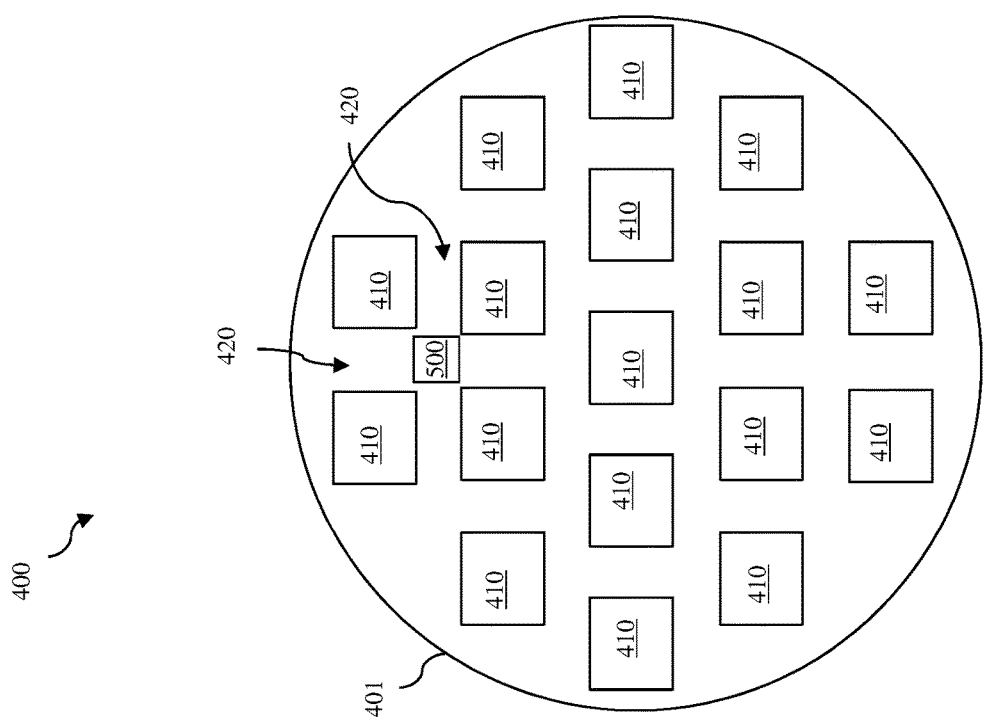

| PAD# | Test Component | Node(s) |
|---|---|---|
| 1 | 1st Test Component | PG Section: PG-R&L Gate |
| 2 | 1st Test Component | PG Section PG-R&L Source |
| 3 | 1st Test Component | PG Section PG-R&L Drain AND PD Section PD-R&L Drain |
| 4 | 1st Test Component | PD Section PD-R&L Source |
| 5 | 1st Test Component | PU Section PU-R&L Drain |
| 6 | 1st Test Component | PU Section PU-R&L Gate AND PD Section PD-R&L Gate |
| 7 | 1st Test Component | PU Section PU-R&L Source |
| 8 | Common for 1st and 2nd Test Components | Dummy Pad #1 |
| 9 | Common for 1st and 2nd Test Components | Dummy Pad #2 |
| 10 | Common | NW/VDD |
| 11 | 2nd Test Component | BL-L |
| 12 | 2nd Test Component | SN-L |
| 13 | 2nd Test Component | VSS-R |
| 14 | 2nd Test Component | VDD-R |
| 15 | 2nd Test Component | VDD-L |
| 16 | 2nd Test Component | VSS-L |
| 17 | 2nd Test Component | SN-R |
| 18 | 2nd Test Component | BL-R |
| 19 | 2nd Test Component | WL |
| 20 | 2nd Test Component | PW |
| 21 | 3rd Test Component | VSS |
| 22 | 3rd Test Component | BL-R |
| 23 | 3rd Test Component | BL-L |
| 24 | 3rd Test Component | WL |
| 25 | All | PW/PSUB (not shown) |

FIG. 11

| 1st Test Component | | | | | | | | Common Dummy Nodes | | |
|---|---|---|---|---|---|---|---|---|---|---|
| Test Parameters | PG-RLG (P1) | PG-RLS (P2) | PG-RLD PD-RLD (P3) | PD-RLS (P4) | PU-RLD (P5) | PU-RLG PD-RLG (P6) | PU-RLS (P7) | (P8) | (P9) | NW Bias (P10) |
| Ixoff | 0 | MI@Vdd | Vdd | 0 | 0 | 0 | 0 | Vdd | 0 | Vdd |
| Igoff | MI@0 | Vdd | 0 | 0 | 0 | 0 | 0 | 0 | 0 | Vdd |
| Igon | MI@Vdd | 0 | Vdd | 0 | 0 | 0 | 0 | Vdd | 0 | 0 |
| Ijx | Vdd | MI@Vdd | Vdd | 0 | 0 | 0 | 0 | Vdd | Vdd | Vdd |

FIG. 12A

| 2nd Test Component | | | | | | | | | | Common Dummy Nodes | | |
|---|---|---|---|---|---|---|---|---|---|---|---|---|
| Test Parameters | BL-L (P11) | SN-L (P12) | VSS-R (P13) | VDD-R (P14) | VDD-L (P15) | VSS-L (P16) | SN-R (P17) | BL-R (P18) | WL (P19) | (P8) | (P9) | NW Bias (P10) |
| Vtsat | Vdd | Vdd | 0 | Vdd | Vdd | 0 | 0 | Vdd | MV@I-tgt | Vdd | 0 | Vdd |
| Idsat | MI@Vdd | Vdd | 0 | Vdd | Vdd | 0 | 0 | Open | Vdd | 0 | 0 | Vdd |

FIG. 12B

IN-KERF TEST STRUCTURE AND TESTING METHOD FOR A MEMORY ARRAY

BACKGROUND

Field of the Invention

The present invention relates to integrated circuit (IC) test structures and testing methods and, more particularly, to a test structure for an integrated circuit (IC) device (e.g., for an on-chip a memory array, such as an on-chip static random access memory (SRAM) array) and to a testing method using such a test structure.

Description of Related Art

More specifically, during integrated circuit (IC) chip manufacturing, multiple instances of an IC chip will be formed on the same wafer. The regions of the wafer bordering and between the IC chips are referred to interchangeably as kerf regions, scribe lines or the product frame. Oftentimes test structures (also referred to as macros), which can be used for in-line monitoring and parameter characterization of on-chip integrated circuit (IC) devices, can be formed within the kerf regions. Such test structures are referred to interchangeably as in-kerf test structures, scribe line test structures or in-frame test structures. Since the kerf regions of the wafer are limited in area, utilizing a minimum amount of area for a given test structure is a key design consideration.

An in-kerf test structure for a static random access memory (SRAM) array typically includes three discrete test components: a first test component used to characterize parameters of the different types of field effect transistors within an SRAM cell in the SRAM array; a second test component used to characterize parameters of the SRAM cell itself; and a third test component used to characterize SRAM cell leakage. Input/output pads are electrically connected to the nodes of test devices (also referred to as devices under test (DUTs)) within each test component of the test structure. During testing of a test device in a given test component, the nodes of that test device are biased using the input/output pads. However, any dummy devices (i.e., devices not subject to testing) that are within the test components and either internal or external to the SRAM cell are largely ignored. The inventors of the present invention have noted that ignoring these dummy devices, particularly, when they are directly connected to a test device, can result in less than accurate characterizations. Therefore, there is a need in the art for an improved in-kerf test structure and testing method for an SRAM array that provides more accurate parameter characterizations. Preferably, the improved in-kerf test structure would not significantly increase the area requirement for the test structure.

SUMMARY

In view of the foregoing, disclosed herein are an improved in-kerf test structure and testing method for testing an on-chip integrated circuit (IC) device (e.g., a memory array, such as static random access memory (SRAM) array). The test structure can be on a semiconductor wafer in a kerf region and can include at least one test component with at least one test device and adjoining dummy devices connected to the test device. Each adjoining dummy device can have at least one proximal node directly connected to a node of a test device and one or more distal nodes that are not directly connected to a node of a test device. The nodes of each test device and the distal nodes of each adjoining dummy device can be electrically connected to input/output pads. During testing the input/output pads can be used to bias the nodes of a selected test device as well as the distal node(s) of any adjoining dummy device that is directly connected to that selected test device. By biasing the distal node(s) of an adjoining dummy device, random accumulation of potential on the distal node(s) of that adjoining dummy device is avoided. Thus, any current contributions from the adjoining dummy device(s) to a current measurement taken from the selected test device during testing can be accurately determined such that any parameter value that is determined for the selected test device based on the current measurement will, in turn, be accurate. Optionally, the size of the test structure can be minimized by limiting the number of input/output pads required, for example, by using only a pair of shared input/output pads to enable biasing of the distal nodes of all of the adjoining dummy devices.

More particularly, disclosed herein is a semiconductor structure that includes a semiconductor wafer and a test structure on the semiconductor wafer (e.g., in a kerf region of the semiconductor wafer adjacent to integrated circuit (IC) chip regions).

The test structure can be configured for testing an on-chip memory array and can include at least one test component. The test component can include at least one test device (e.g., within a memory cell or encompassing the memory cell) and adjoining dummy devices. For purpose of this disclosure, a test device refers to a device under test (DUT) (i.e., a device that is subject to testing) and a dummy device refers to a device that is not subject to testing. In the test component, each test device can have first nodes and each adjoining dummy device can have second nodes including at least one proximal second node that is directly connected to a first node of a test device and at least one distal second node that is not directly connected to any of the first nodes of any test devices.

In one exemplary embodiment, the test structure can be configured specifically for testing a static random access memory (SRAM) array. This test structure can include three test components: a first test component, a second test component and a third test component.

The first test component can be configured for characterization of parameters of the three different types of field effect transistors (FETs) within an SRAM cell of the SRAM array. Specifically, the first test component can include three sections including: a first section configured for pass gate (PG) NFET characterization; a second section configured for pull up (PU) PFET characterization; and a third section configured for pull down (PD) NFET characterization. Each section of the first test component can include test devices within an SRAM cell. For example, the first section will have a first instance of an SRAM cell and since the first section is for PG NFET characterization, the test devices will be the PG NFETs with the SRAM cell. Similarly, the second section will have a second instance of the SRAM cell and since the second section is for PU PFET characterization, the test devices will be the PU PFETs with the SRAM cell. Finally, the third section will have a third instance of an SRAM cell and since the third section is for PD NFET characterization, the test devices will be the PD NFETs with the SRAM cell. Each section of the first test component will further include adjoining dummy devices and, particularly, both internal adjoining dummy devices within the SRAM cell and external adjoining dummy devices outside the SRAM cell.

The second test component can be configured for characterization of parameters of the SRAM cell itself. The second test component can include yet another instance of the SRAM cell, as the test device, and various adjoining external dummy devices.

The third test component can be configured for SRAM cell leakage characterization. This third test component can also include an instance of the SRAM cell, as the test device, but does not include the adjoining external dummy devices.

Each of the various test devices in the test components described above can have first nodes. Additionally, each of the adjoining dummy devices including each of the internal and external adjoining dummy device in the different sections of the first test component and each of the external adjoining dummy devices in the second test component, can have second nodes including at least one proximal second node that is directly connected to a first node of a test device and at least one distal second node that is not directly connected to any of the first nodes of any test devices.

In any case, the test structure can further include input/output pads, which are electrically connected to the first nodes of each test device in the test structure and to the distal second node(s) of each adjoining dummy device. During testing of a selected test device, these input/output pads enable biasing of the first nodes of the selected test device and each distal second node of any adjoining dummy devices. By biasing the distal second node(s) of an adjoining dummy device, random accumulation of potential on the distal second node(s) of that adjoining dummy device is avoided. Thus, any current contributions from the adjoining dummy device(s) to a current measurement taken from the selected test device during testing can be accurately determined. As a result, any parameter value that is determined for the selected test device based on the current measurement will, in turn, be accurate.

Optionally, the size of the test structure described above can be minimized by limiting the number of input/output pads required, for example, by using only a pair of shared input/output pads to enable biasing of the distal second nodes of all of the adjoining dummy devices.

Also disclosed herein is a testing method for testing an on-chip memory array (e.g., a static random access memory (SRAM) array) using an in-kerf test structure. Specifically, the method includes forming a test structure on a semiconductor wafer (e.g., in a kerf region of the semiconductor wafer adjacent to integrated circuit (IC) chip regions). The test structure formed on the semiconductor wafer can be configured as discussed above. The method can further include testing a selected test device. During the testing of the selected test device, the input/output pads can be used to bias the first nodes of the selected test device and each distal second node of any of the adjoining dummy devices that are directly connected to the selected test device. By biasing the distal second node(s) of an adjoining dummy device, random accumulation of potential on the distal second node(s) of that adjoining dummy device is avoided. Thus, any current contributions from the adjoining dummy device(s) to a current measurement taken from the selected test device during testing can be accurately determined. As a result, any parameter value that is determined for the selected test device based on the current measurement will, in turn, be accurate.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 3 is a table listing a set of twenty-five input/output pads used in the test structure of FIG. 2 and the nodes to which they are connected;

FIG. 4 is a top view diagram illustrating an embodiment of a semiconductor structure that includes, on a semiconductor wafer, integrated circuit chip regions and an in-kerf test structure;

FIG. 11 is a table illustrating listing a set of twenty-five input/output pads used in the test structure of FIG. 5 and the nodes to which they are connected;

FIGS. 12A-12B are tables associating specific nodes in the first test component and second component with specific input/output pads and the various bias conditions applied by those specific input/output pads to the nodes during different tests.

DETAILED DESCRIPTION

More specifically, during integrated circuit (IC) chip manufacturing, multiple instances of an IC chip will be formed on the same wafer. The regions of the wafer bordering and between the IC chips are referred to interchangeably as kerf regions, scribe lines or the product frame. Oftentimes test structures (also referred to as macros), which can be used for in-line monitoring and parameter characterization of on-chip integrated circuit (IC) devices, can be formed within the kerf regions. Such test structures are referred to interchangeably as in-kerf test structures, scribe line test structures or in-frame test structures. Since the kerf regions of the wafer are limited in area, utilizing a minimum amount of area for a given test structure is a key design consideration.

Figure 1:
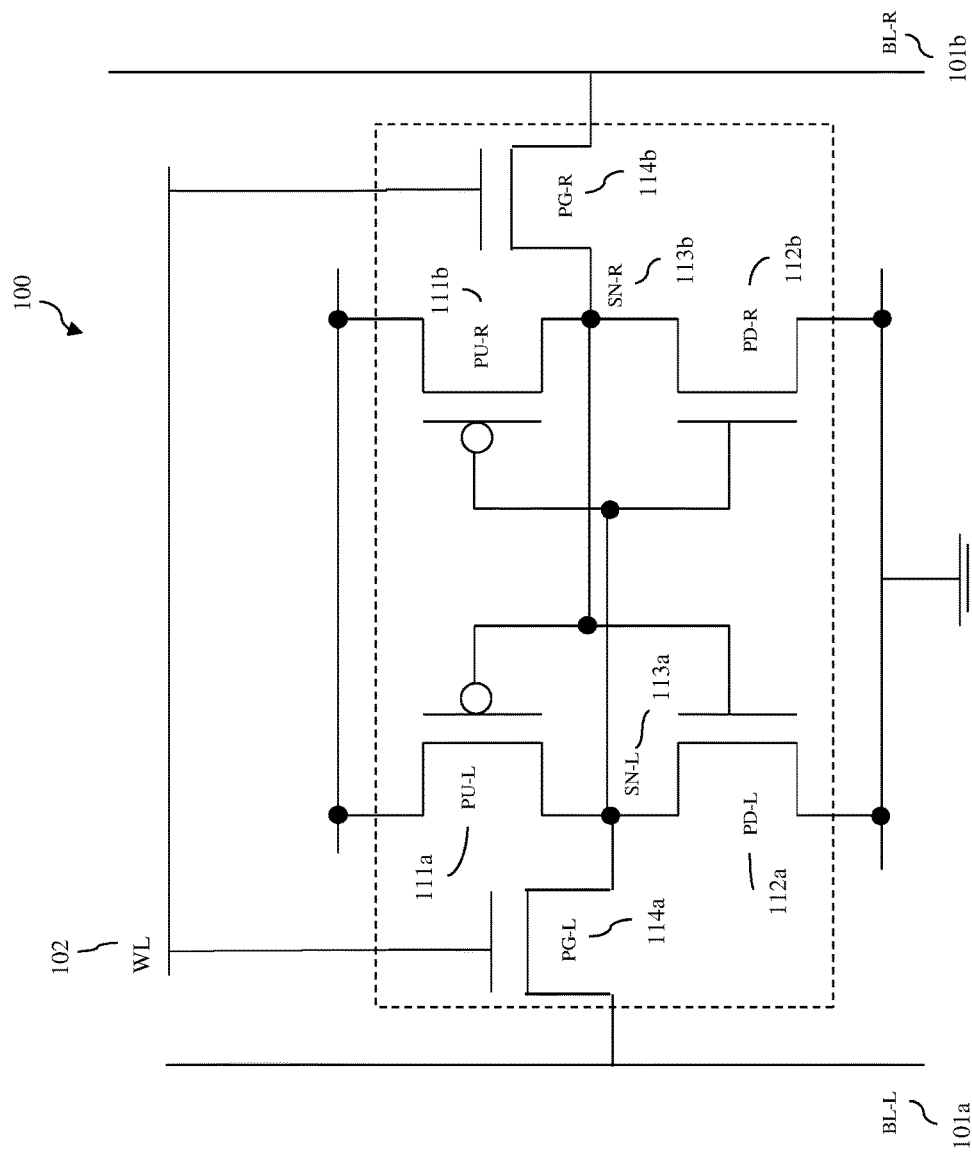
FIG. 1 is a schematic diagram illustrating an exemplary six-transistor (6T) static random access memory (SRAM) cell.

FIG. 1 is a schematic diagram illustrating an exemplary six-transistor (6T) SRAM cell 100 that can be incorporated into an SRAM array. This SRAM cell 100 can include a pair of pass-gate (PG)N-type field effect transistors (NFETs) including a left-side PG NFET (PG-L) 114*a* and a right-side PG NFET (PG-R) 114*b*. The SRAM cell 100 can further include a pair of cross-coupled inverters. Each inverter can include a pull-up (PU) P-type field effect transistor (PFET) (e.g., see left-side PU PFET (PU-L) 111a and right-side PU PFET (PU-R) 111b) connected in series to a pull-down (PD) NFET (e.g., see left side PD NFET (PD-L) 112a and right-side PD NFET (PD-R) 112b). The drain of PG-L 114a can be connected to a left-side data storage node (SN-L) 113a between the PU-L 111a and PD-L 112a of one of the inverters and the drain of the PG-R 114b can be connected to a right-side data storage node (SN-R) 113b between the PU-R 111b and PD-R 112b of the other inverter. Furthermore, the source of PG-L 114a can be connected to one bitline of a complementary pair of bitlines (e.g., the left-side bitline (BL-L) 101a, which is also referred to as a true bitline) and the source of PG-R 114b can be connected to the other bitline in the complementary pair of bitlines (e.g., the right-side bitline (BL-R) 101b, also referred to as the complementary bitline). The gates of PG-L 114a and PG-R 114b can be connected to a wordline (WL) 102.

Such a 6T SRAM cell 100 can operate in three different stages: standby, write and read. In the standby state, the cell is idle. In the write stage, a data value is written into the cell. Specifically, if a data value of "1" (i.e., a high data value) is to be written to SN-L 113a, a "1" is applied to BL-L 101a and a "0" is applied to BL-R 101b. Then, WL 102 is activated to enable PG-L 114a and PG-R 114b and the data value "1" is stored at SN-L 113a. Contrarily, if a data value of "0" (i.e., a low data value) is to be written to SN-L 113a, a "0" is applied to BL-L 101a and a "1" is applied to BL-R 101b. Then, the WL 102 is activated to enable PG-L 114a and PG-R 114b and the data value "0" is stored at SN-L 113a. In the reading stage, the data value stored in the cell is read. Specifically, BL-L 101a and BL-R 101b are both pre-charged high (i.e., to a "1") and WL 102 is activated to enable PG-L 114a and PG-R 114b. When a data value of "1" is stored on SN-L 113a, BL-L 101a will remain charged at its pre-charge level of "1" and BL-R 101b will be discharged to "0" through the PD-R 112b and PG-R 114b. When a data value of "0" is stored on SN-L 113a, BL-L 101a will be discharged to "0" through PD-L 112a and PG-L 114a and BL-R 101b will remain charged at its pre-charge level of "1". A sense amplifier will sense whether BL-L 101a or BL-R 101b is higher and, thereby will sense the data value stored in the SRAM.

Figure 2:
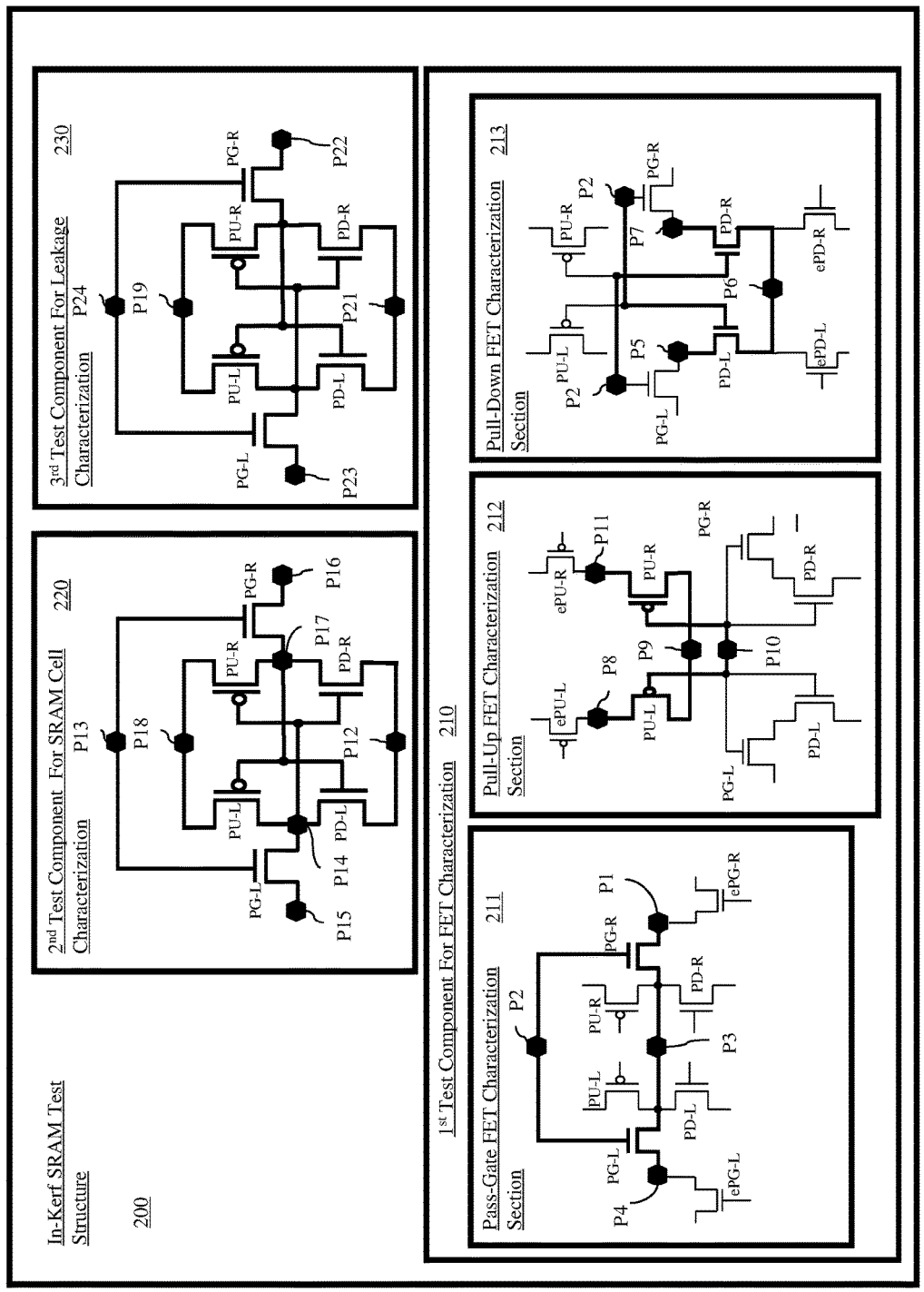
FIG. 2 is a schematic diagram illustrating a conventional in-kerf test structure for an SRAM array that includes 6T SRAM cells.

FIG. 2 is a schematic diagram illustrating a conventional in-kerf test structure 200 for an SRAM array that includes 6T SRAM cells such as the 6T SRAM cell shown in FIG. 1. The test structure 200 includes three discrete test components. Specifically, the test structure 200 includes a first test component 210, a second test component 220 and a third test component 230.

The first test component 210 is used to characterize parameters of the three different types of field effect transistors (FETs) within the 6T SRAM cell (i.e., the PG NFETs, the PU PFETs and the PD NFETs). Specifically, the first test component 210 includes three discrete test sections. Each of the test sections includes test devices (i.e., devices under test (DUTs)) within an instance of the SRAM cell at issue and also adjoining dummy devices (i.e., device that are not subject to testing), but that are connected to the test devices. The adjoining dummy devices can be both internal dummy devices (i.e., devices that are internal to the SRAM cell) and external dummy devices (i.e., devices that are external to the SRAM cell).

Specifically, the first test section 211 of the first test component 210 is a PG NFET parameter characterization section, wherein the test devices include PG-L and PG-R within a first instance of an SRAM cell, wherein internal adjoining dummy devices include PU-L, PU-R, PD-L, and PD-R within the first instance of the SRAM cell and wherein external adjoining dummy devices include, for example, ePG-L and ePG-R and, optionally, other devices not shown outside the first instance of the SRAM cell. The second test section 212 of the first test component 210 is a PU PFET parameter characterization section, wherein the test devices include PU-L and PU-R with a second instance of the SRAM cell, wherein the internal adjoining dummy devices include PD-L, PD-R, PG-L, and PG-R with the second instance of the SRAM cell and wherein the external adjoining dummy devices include, for example, ePU-L and ePU-R and, optionally, other devices outside the second instance of the SRAM cell. The third test section 213 of the first test component 210 is a PD NFET parameter characterization section, wherein the test devices include PD-L and PD-R with a third instance of the SRAM cell, wherein the internal adjoining dummy devices include PU-L, PU-R, PG-L, and PG-R within the third instance of the SRAM cell and wherein the external adjoining dummy devices include, for example, ePD-L and ePD-R and, optionally, other devices outside the third instance of the SRAM cell.

The second test component 220 is used to characterize parameters of the SRAM cell itself. The second test component 220 includes an SRAM cell, as the test device, and various external adjoining dummy devices (not shown).

The third test component 230 is used to characterize SRAM cell leakage. This third test component 230 also includes an SRAM cell, as the test device, but does not include the external adjoining dummy devices.

In any case, within the test structure 200, nodes of the test devices in each of the test components (or section thereof) are all electrically connected to input/output pads within a given set of input/output pads (e.g., a set of twenty-five specific input/output pads P1-P25). Connection of the nodes of test devices to the input/output pads enables those nodes to be appropriately biased during testing to obtain specific measurements at issue. For example, in each of the test sections 211-213 of the first test component 210, the test devices are all FETs (e.g., PG NFETs, PU PFETs and PD NFETs, respectively). Each FET has four nodes including the source (S), drain (D), gate (G) and body (B) and each of these nodes will be electrically connected to a particular input/output pad in the set of twenty-five input/output pads (P1-P25). FIG. 3 is a table listing each of the twenty-five input/output pads P1-P25 in the test structure 200 and the specific node(s) of the specific test devices in each test component (or section thereof, if applicable) to which those twenty-five input/output pad P1-P25 are electrically connected.

As mentioned above, each section 211-213 in the first test component 210 and the second test component 220 include both test devices and adjoining dummy devices connected to the test devices. However, the adjoining dummy devices are largely ignored during testing. Specifically, while any node of an adjoining dummy device that is shared with a selected test device is biased during testing of the selected test device, all other nodes of the adjoining dummy device are left unbiased (or floating). In other words, only those nodes of an adjoining dummy device that are directly connected to a node of a selected test device will be biased. The remaining nodes of the adjoining dummy device are not electrically connected to one of the twenty-five input/output pads P1-P25 and, thus, remain unbiased (i.e., floating) during testing. The inventors of the present invention have noted that, when an adjoining dummy device with floating node(s) also has a shared node with a selected test device, current that passes through the adjoining dummy device during testing cannot be accurately measured or estimated because of a random accumulation of potential on the floating node(s). This current can contribute to the value of a current measurement, which is taken from the selected test device during testing and which is subsequently used to characterize parameters (e.g., current and/or voltage parameters) of the selected test device. Thus, the parameter characterizations for the test device may be less than accurate.

For example, as mentioned above, in the PG NFET parameter characterization section 211 in the first test component 210, the test devices (i.e., the devices under test (DUTs)) with the SRAM cell are PG-L and PG-R. Considering PG-L, one exemplary current parameter that can be characterized is the off-state junction leakage current (Ixoff). Those skilled in the art will recognize that Ixoff for PG-L will be equal to the sum of the gate-induced drain leakage current (Igidl) for PG-L and the drain-to-substrate junction leakage current (Ijx)) for PG-L. So, Igidl and Ijx for PG-L must be determined in order to determine Ixoff. To determine Igidl and Ijx for PG-L, the current (I) at input/output pad 4 (P4), which is connected to the drain of PG-L, is measured, when the nodes of PG-L are biased as follows: Vgate biased to 0V, Vdrain biased to Vdd, Vsource biased to Vdd, and Vsubstrate biased to 0V. However, if P4 is also connected to the drain of an adjoining dummy device (ePG-L), which in this case is external to the SRAM cell, then the measured value of I at P4 will include current contributions, not only from PG-L, but also from ePG-L. That is, the measured value of I at P4 will include the following current contributions: from PG-L, Ixoff and the off-state gate current (Igoff); and, from ePG-L, the drain-to-substrate junction leakage current (Ijx), the off-state gate current (Igoff), the gate-induced drain leakage current (Igidl), and the off-state source current (Isoff). Unfortunately, since the random accumulation of potential at both the G and S nodes of ePG-L will be unknown, Igoff, Igidl, and Isoff for the ePG-L cannot be estimated with certainty. As a result, Ixoff for PG-L can also not be estimated with certainty. Similar estimation issues can arise when trying to determine other current parameters for the test device including, but not limited to, the on-state gate current (Igon), Igoff, the off-state drain current (Idoff), Igidl, etc. Therefore, there is a need in the art for an improved in-kerf test structure and testing method for an SRAM array that provides more accurate parameter characterizations (e.g., current and/or voltage parameter characterizations). Preferably, the improved in-kerf test structure would not significantly increase the area requirement for the test structure.

In view of the foregoing, disclosed herein are an improved in-kerf test structure and testing method for testing an on-chip integrated circuit (IC) device (e.g., a memory array, such as static random access memory (SRAM) array). The test structure can be on a semiconductor wafer in a kerf region and can include at least one test component with at least one test device and adjoining dummy devices connected to the test device. Each adjoining dummy device can have at least one proximal node directly connected to a node of a test device and one or more distal nodes that are not directly connected to a node of a test device. The nodes of each test device and the distal nodes of each adjoining dummy device can be electrically connected to input/output pads. During testing the input/output pads can be used to bias the nodes of a selected test device as well as the distal node(s) of any adjoining dummy device that is directly connected to that selected test device. By biasing the distal node(s) of an adjoining dummy device, random accumulation of potential on the distal node(s) of that adjoining dummy device is avoided. Thus, any current contributions from the adjoining dummy device(s) to a current measurement taken from the selected test device during testing can be accurately determined such that any parameter value that is determined for the selected test device based on the current measurement will, in turn, be accurate. Optionally, the size of the test structure can be limited by limiting the number of input/output pads required, for example, by using only a pair of shared input/output pads to enable biasing of the distal nodes of all of the adjoining dummy devices.

More particularly, referring to FIG. 4, disclosed herein is a semiconductor structure 400 that includes a semiconductor wafer 401 and a test structure 500 on the semiconductor wafer 401 (e.g., in a kerf region 420 of the semiconductor wafer 401 adjacent to one or more integrated circuit (IC) chip regions 410).

Figure 5:
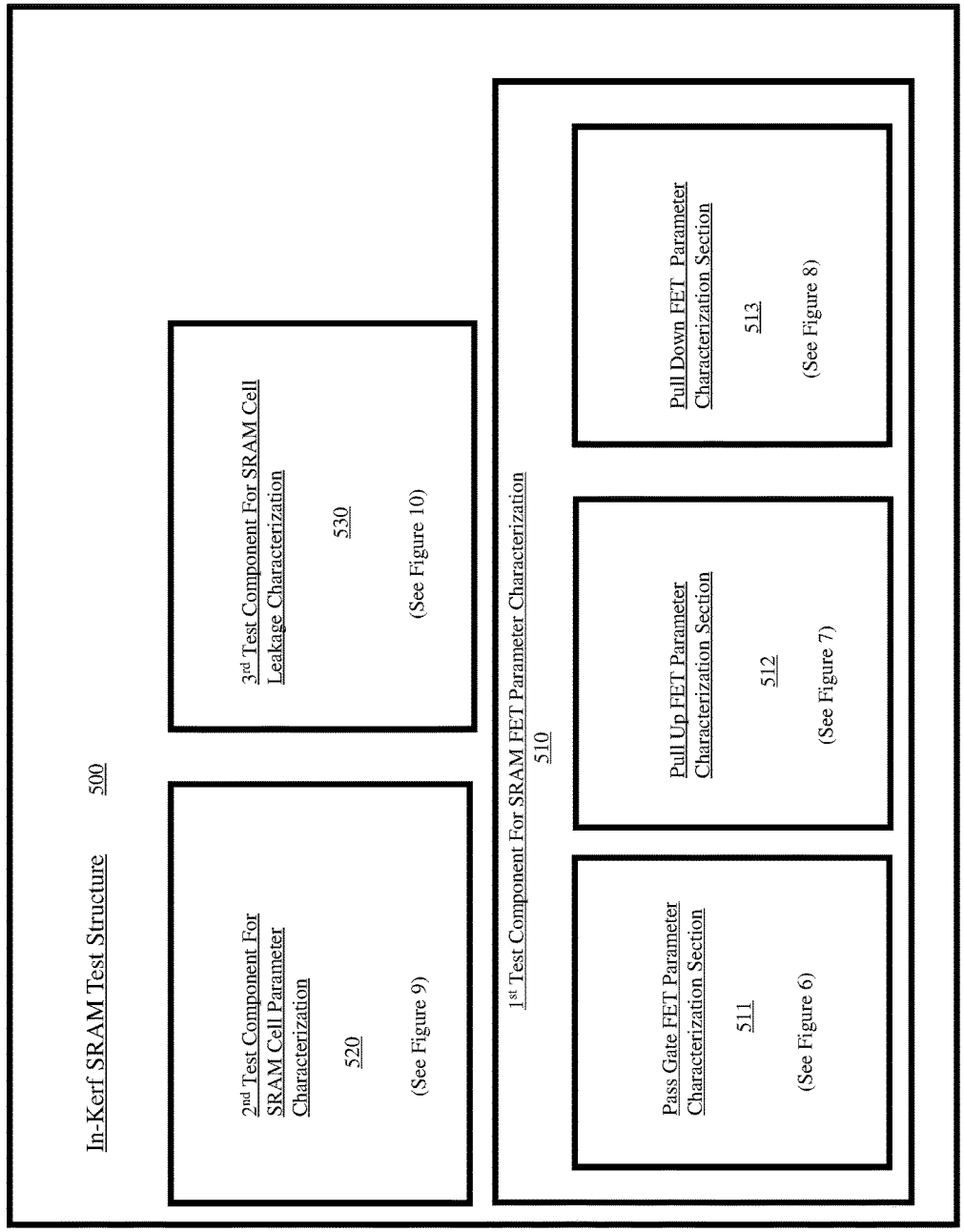
FIG. 5 is a block view diagram illustrating an embodiment of an in-kerf test structure that can be incorporated into the semiconductor structure of FIG. 4 and that includes a first test component, a second test component and a third test component.

Referring to FIG. 5, the test structure 500 on the semiconductor structure 400 of FIG. 4 can be configured for testing an on-chip memory array (i.e., a memory array formed in each of the IC chip regions 410) and can include one or more test components for characterizing different aspects of that on-chip memory array.

For example, if the memory array at issue is a static random access memory (SRAM) array that includes static random access memory (SRAM) cells, such as the 6T SRAM cell of FIG. 1, the test structure 500 can include three discrete test components including a first test component 510, a second test component 520, and a third test component 530.

The first test component 510 can be configured to characterize parameters of the three different types of field effect transistors (FETs) within the 6T SRAM cell (e.g., the PG NFETs, the PU PFETs and the PD NFETs). Specifically, the first test component 510 can include three discrete test sections including a first test section 511 (e.g., see the schematic drawing in FIG. 6 illustrating an exemplary first test section 511 and detailed discussion below), a second test section 512 (e.g., see the schematic drawing in FIG. 7 illustrating an exemplary second test section 512 and the detailed discussion below) and a third test section 513 (e.g., see the schematic drawing in FIG. 8 illustrating an exemplary third test section 513 and the detailed description below).

Figure 6:
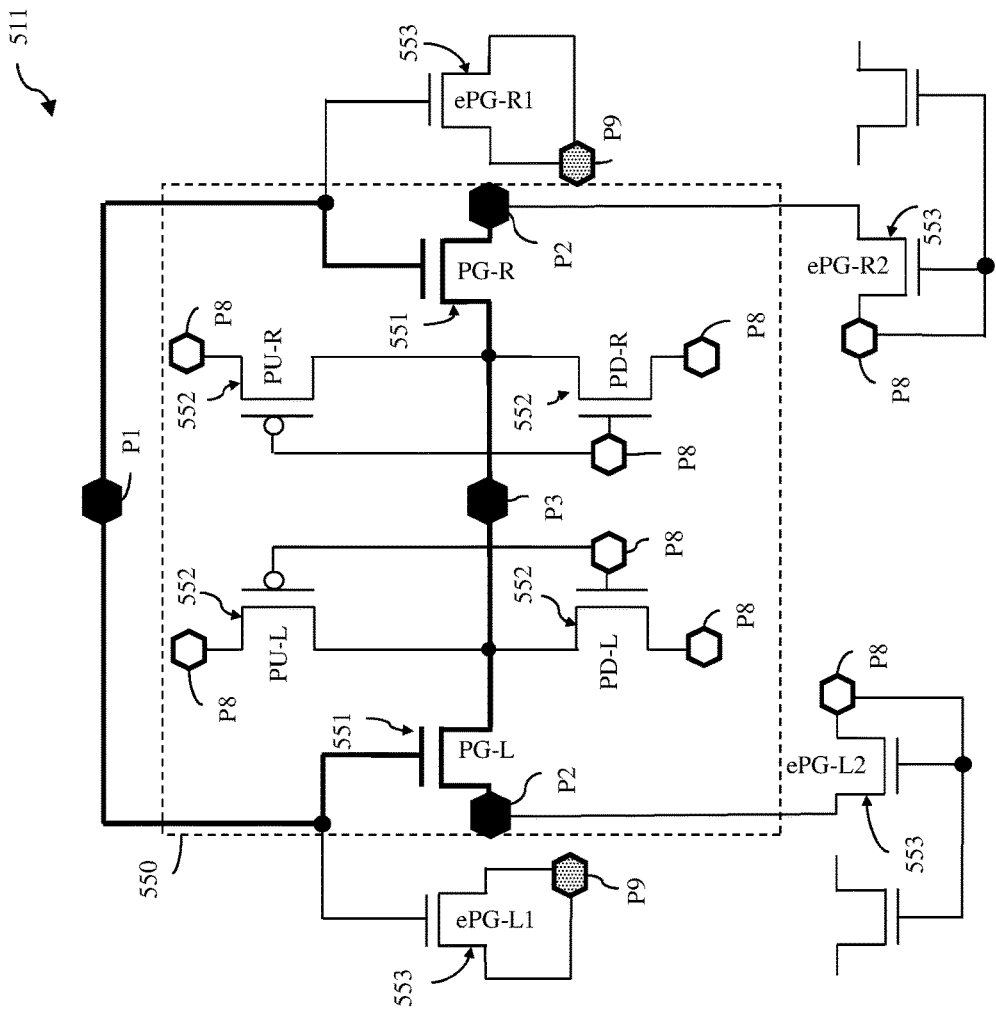
FIG. 6 is a schematic diagram illustrating a first test section of the first test component of the in-kerf test structure of FIG. 5.
Figure 7:
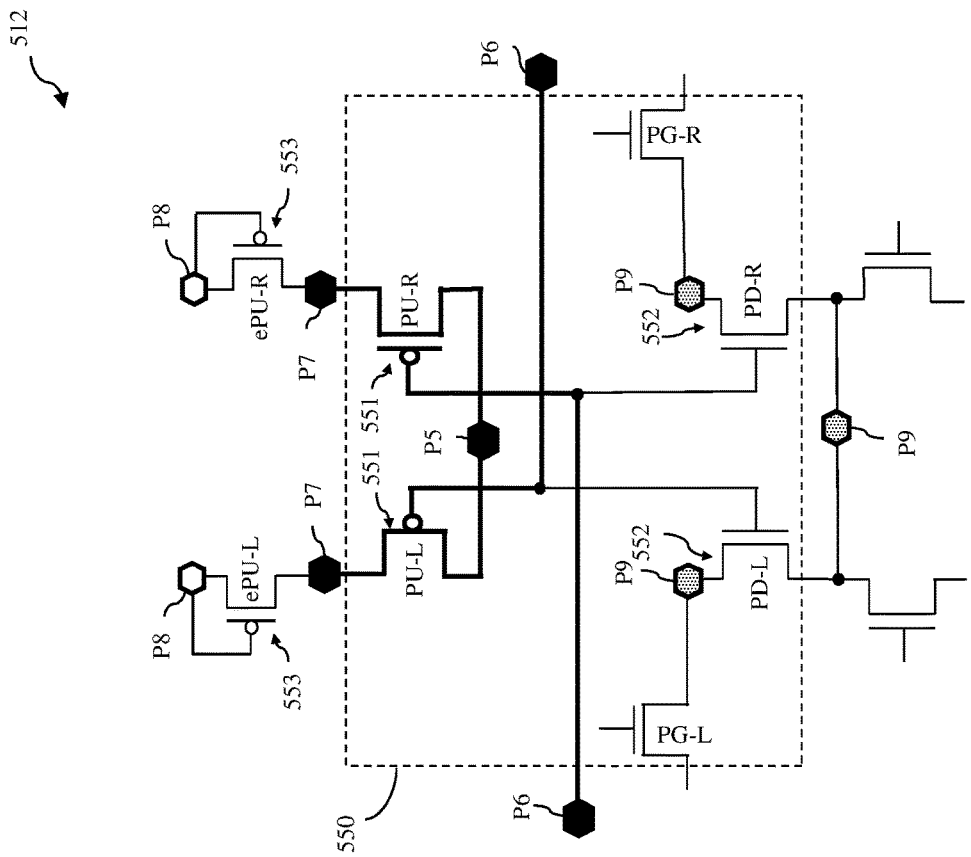
FIG. 7 is a schematic diagram illustrating a second test section of the first test component of the in-kerf test structure of FIG. 5.
Figure 8:
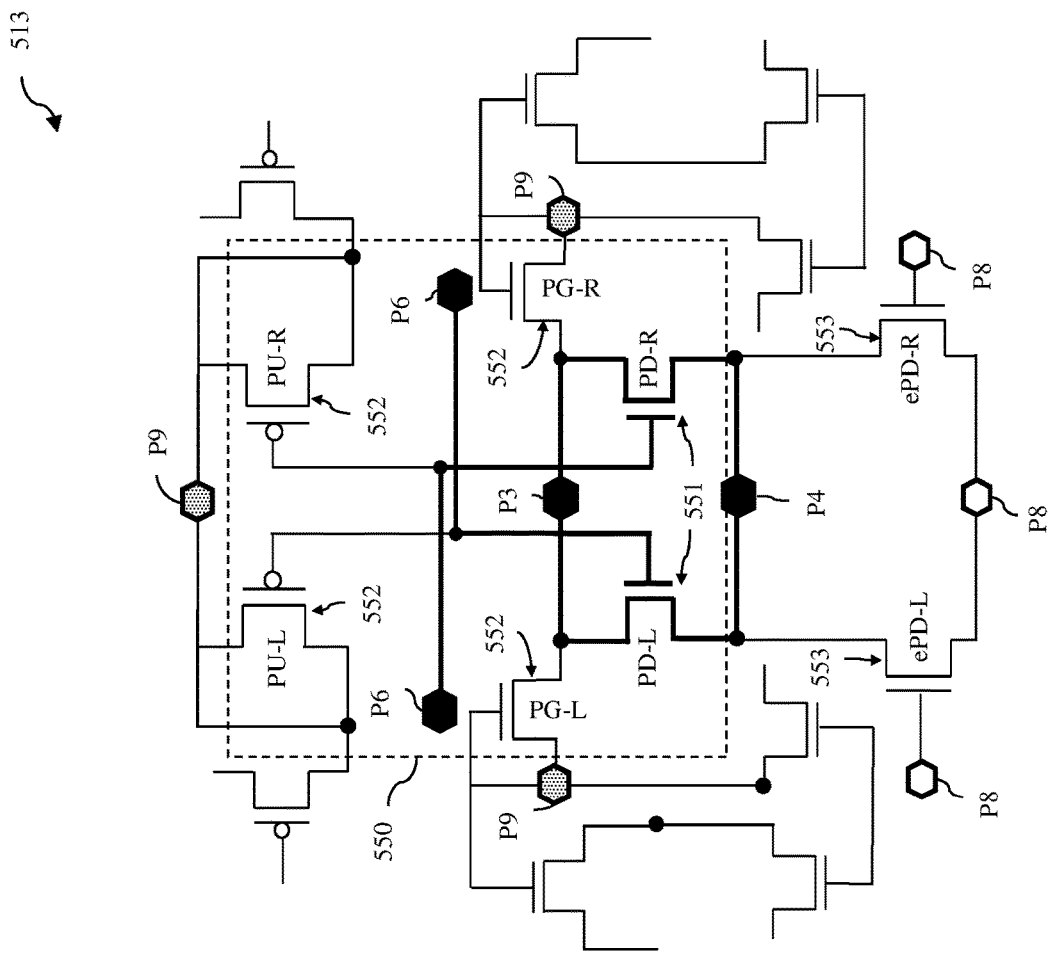
FIG. 8 is a schematic diagram illustrating a third test section of the first test component of the in-kerf test structure of FIG. 5.

Referring to FIG. 6-8, each of the test sections 511, 512, 513 can include test devices 551 (i.e., devices under test (DUTs)) within a discrete instance of the SRAM cell 550 and also adjoining dummy devices (i.e., devices and, particularly, FETs that are not subject to testing), but that are directly connected to one or more of the test devices 551. As illustrated, the adjoining dummy devices can include both internal adjoining dummy devices 552 (i.e., dummy devices that are internal to the SRAM cell 550 and directly connected to at least one node of a test device 551) and external adjoining dummy devices 553 (i.e., dummy devices that are external to the SRAM cell 550 and directly connected to at least one node of a test device 551).

Specifically, as shown in FIG. 6, the first test section 511 of the first test component 210 is a PG NFET parameter characterization section, wherein the test devices 551 include PG-L and PG-R within a first instance of the SRAM cell 550, wherein internal adjoining dummy devices 552 include PU-L, PU-R, PD-L, and PD-R within the first instance of the SRAM cell 550 and wherein external adjoining dummy devices 553 include ePG-L1, ePG-L2, ePG-R1, and ePG-R2, outside the first instance of the SRAM cell 550.

As shown in FIG. 7, the second test section 512 of the first test component 510 is a PU PFET parameter characterization section, wherein the test devices 551 include PU-L and PU-R within a second instance of the SRAM cell 550, wherein the internal adjoining dummy devices 552 include PD-L and PD-R within the second instance of the SRAM cell 550 and wherein the external adjoining dummy devices 553 include ePU-L, and ePU-R outside the second instance of the SRAM cell 550.

As shown in FIG. 8, the third test section 513 of the first test component 510 is a PD NFET parameter characterization section, wherein the test devices 551 include PD-L and PD-R within a third instance of the SRAM cell 550, wherein the internal adjoining dummy devices 552 include PU-L, PU-R, PG-L, and PG-R within the third instance of the SRAM cell 550 and wherein the external adjoining dummy devices 553 include ePD-L and ePD-R outside the third instance of the SRAM cell 550.

The second test component 520 can be configured to characterize parameters of the SRAM cell 550 itself. As illustrated in the schematic drawing of FIG. 9, the second test component 520 can include a fourth instance of the SRAM cell 550. In this case, the fourth instance of the SRAM cell 550, as a whole, is the test device 551. The second test component 520 can further include various external adjoining dummy devices 553 (e.g., ePG-L1, ePG-L2, ePU-L, ePD-L, ePD-R, ePU-L, ePU-R, ePG-R1, and ePG-R2) directly connected to the test device 551.

The third test component 530 can be configured to characterize SRAM cell leakage. As illustrated in the schematic drawing of FIG. 10, this third test component 530 includes a fifth instance of the SRAM cell 550. In this case, the fifth instance of the SRAM cell 550, as a whole, is the test device 551 and the third test component 530 does not include any external adjoining dummy devices.

As mentioned above, the inventors of the present invention have noted that, when a test device is connected to an adjoining dummy device with floating node(s), current that passes through the adjoining dummy device during testing cannot be accurately measured or estimated because of a random accumulation of potential on the floating node(s). This current can contribute to the value of a current measurement, which is taken from the selected test device during testing and which is subsequently used to characterize parameters (e.g., current and/or voltage parameters) of the selected test device. Thus, the parameter characterizations for the test device may be less than accurate. To avoid the random accumulation of potential on nodes of the adjoining dummy devices 552-553 within the different test sections 511-513 of the first test component 510 as well as within the second test component 520, the test structure 500 disclosed herein is further configured to allow for biasing of the various nodes on the adjoining dummy devices 552-553.

Figure 9:
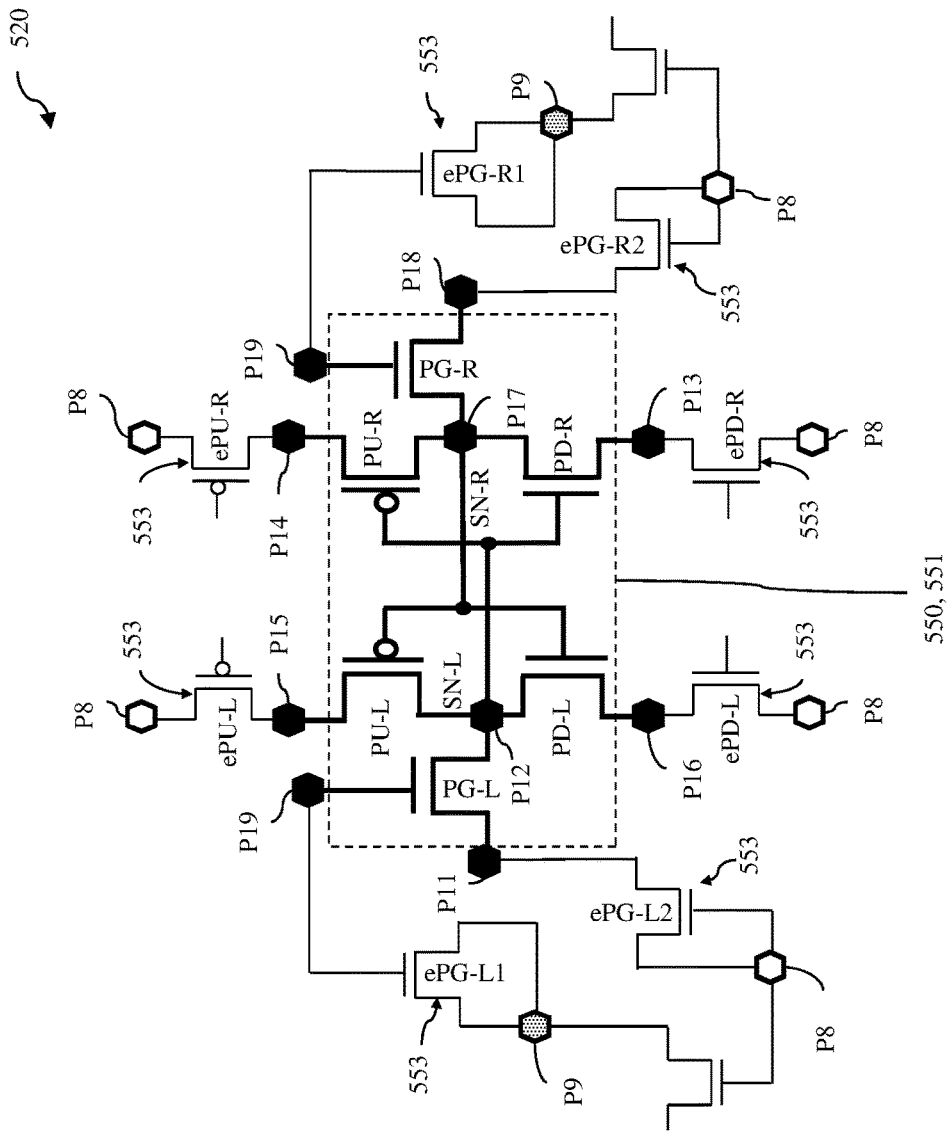
FIG. 9 is a schematic diagram illustrating the second test component of the in-kerf test structure of FIG. 5.
Figure 10:
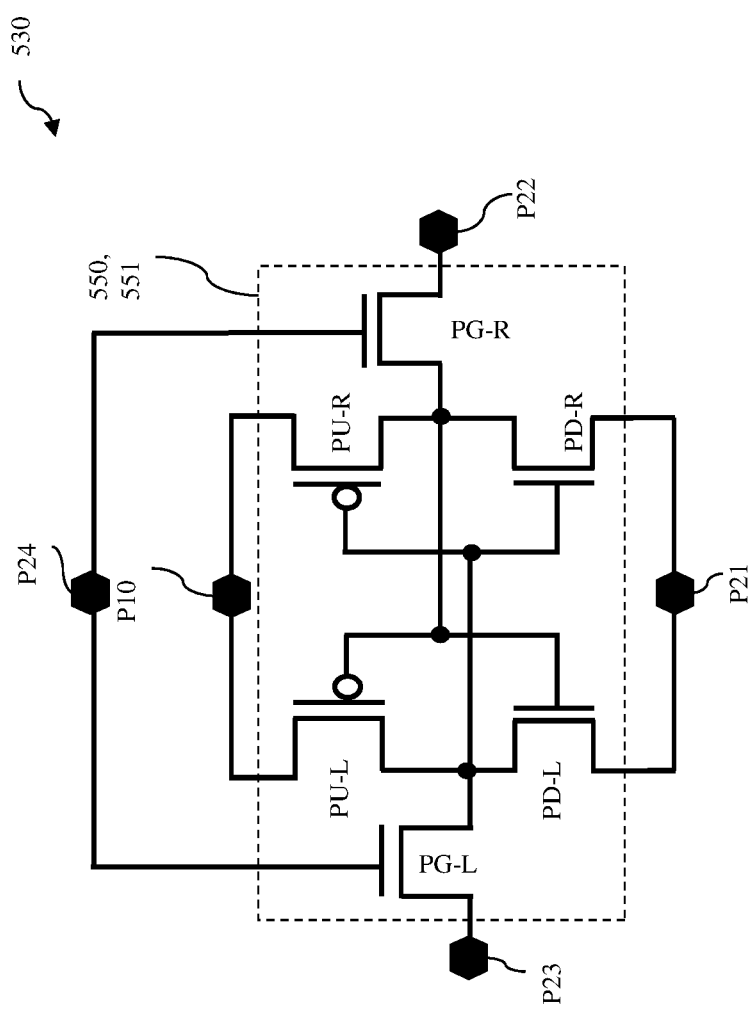
FIG. 10 is a schematic diagram illustrating the third test component of the in-kerf test structure of FIG. 5.

More particularly, referring to the test sections 511-513 of the first test component 510 shown in FIGS. 6-8, the second test component 520 shown in FIG. 9, and the third test component 530 shown in FIG. 10, each test device 551 within the test structure 500 can have first nodes. Additionally, each adjoining dummy device 552 or 553 (i.e., each internal and external dummy device that is directly connected to at least one node of a test device 551) in the test sections 511-513 of the first test component 510 and in the second test component 520 can have second nodes, which include at least one proximal second node that is directly connected to a first node of a test device 551 and at least one distal second node that is not directly connected to any of the first nodes of any test device 551.

Those skilled in the art will recognize that the nodes of a FET include the source (S), drain (D), and gate (G). Thus, for example, referring to the first test section 511 of the first test component 510 shown in FIG. 6, the drains of the internal adjoining dummy devices PU-L, PD-L, PU-L and PU-R are proximal second nodes that are connected to the drains of the test devices PG-L and PG-R and the gates and sources of those internal adjoining dummy devices are distal second nodes. Additionally, the gates of the external adjoining dummy devices ePG-L1 and ePGL2 are proximal second nodes that are connected to the gates of the test devices PG-L and PG-R and the sources and drains of those external adjoining dummy devices are distal second nodes. The drains of the external adjoining dummy devices ePG-L2 and ePG-R2 are proximal second nodes that are connected to the sources of the test devices PG-L and PG-R and the sources and gates of those external adjoining dummy devices are distal second nodes.

Referring to the second test section 512 of the first test component 510 shown in FIG. 7, the gate of the internal adjoining dummy devices PD-L and PD-R are proximal second nodes that are connected to the gates of test devices PU-L and PU-R, respectively, and the sources and drains of those internal adjoining dummy devices are distal second nodes. Additionally, the drains of external adjoining dummy devices ePU-L and ePU-R are proximal second nodes that are connected to the sources of the test devices PU-L and PU-R, respectively, and the sources and gates of those external adjoining dummy devices are distal second nodes.

Referring to the third test section 513 of the first test component 510 shown in FIG. 8, the drains of the internal adjoining dummy devices PG-L and PG-R are proximal second nodes that are connected to the drains of the test devices PD-L and PD-R, respectively, and the gates and sources of those internal adjoining dummy devices are distal second nodes. The gates of the internal adjoining dummy devices PU-L and PU-R are proximal second nodes that are connected to the gates of the test devices PD-L and PD-R, respectively, and the sources and drains of those internal adjoining dummy devices are distal second nodes. Additionally, the drains of the external adjoining dummy devices ePD-L and ePD-R are proximal second nodes that are connected to the sources of the test devices PD-L and PD-R, respectively, and the sources and gates of those external adjoining dummy devices are distal second nodes.

Referring to the second test component 520 shown in FIG. 9, as mentioned above, all of the adjoining dummy devices in this second test component 520 are external adjoining dummy devices 553. In this case, the drains of the external adjoining dummy devices ePU-L and ePU-R are proximal second nodes connected to the sources of PU-L and PU-R, respectively, in the test device 551 and the sources and gates of those external adjoining dummy devices are distal second nodes. The drains of the external adjoining dummy devices ePD-L and ePD-R are proximal second nodes connected to the sources of PD-L and PD-R, respectively, in the test device 551 and the gates and sources of those external adjoining dummy devices are distal second nodes. The gates of the external adjoining dummy devices ePG-L1 and ePG-R1 are proximal second nodes connected to the gates of PG-L and PG-R, respectively, in the test device 551 and the sources and drains of those external adjoining dummy devices are distal second nodes. Furthermore, the drains of the external adjoining dummy devices ePG-L2 and ePG-R2 are proximal second nodes connected to the sources of PG-L and PG-R, respectively, in the test device 551 and the gates and sources of those external adjoining dummy devices are distal second nodes.

It should be noted that in the various test sections 511-513 and test components 510-530 described above left and right side devices of the same type will be essentially the same (e.g., will have essentially the same configuration, the same dimensions, same dopant concentrations, etc.). That is, left and right side PG NFETs will be essentially the same, left and right-side PD NFETs will be essentially the same, and left and right side PU PFETs will be essentially the same. Additionally, in the test sections 511-513 of the first test component 510 and in the second test component 520, external adjoining dummy devices will be essentially the same as the corresponding internal devices. For example, ePG NFETs that are external to the SRAM cell will be essentially the same as the PG NFETs that are internal to the SRAM cell. Similarly, ePD NFETs that are external to the SRAM cell will be essentially the same as the PD NFETs that are internal to the SRAM cell and ePU PFETs that are external to the SRAM cell will be essentially the same as the PU PFETs that are internal to the SRAM cell.

The test structure 500 can further include a set of input/output pads (see exemplary input/output pads P1-P25 placed throughout the schematic diagrams in FIGS. 6-10 showing the test sections 511-513 of the first test component 510, the second test component 520 and the third test component). As illustrated, input/output pads from this set can be electrically connected to the first nodes of each test device 551 in each test section 511-513 of the first test component 510, to the test device 551 in the second test component 520 and to the test device 551 in the third test component 530. Additionally, input/output pads from this set can also be electrically connected to the distal second nodes of the adjoining dummy devices 552-553 mentioned above (i.e., to the distal second nodes of the internal and external adjoining dummy device 552-553 in each of the three test sections 511-513 of the first test component 510 and to the distal second nodes of the external adjoining dummy devices 553 within the second test component 520).

During testing of any selected test device 551 in the test structure 500 in order to characterize a particular parameter for that selected test device 551 (e.g., a current or voltage parameter), these input/output pads enable biasing of the first nodes of the selected test device 551 and also enable biasing of each distal second node of any adjoining dummy device 552 and/or 553 that is directly connected to that selected test device 551. By biasing the distal second node(s) of an adjoining dummy device 552 or 553, random accumulation of potential on the distal second node(s) of that adjoining dummy device is avoided. Thus, any current contributions from the adjoining dummy device(s) to a current measurement taken from the selected test device during testing can be accurately determined. As a result, any parameter value (e.g., a current or voltage parameter value) that is determined for the selected test device based on the current measurement will, in turn, be accurate.

It should be noted that to determine the optimal bias conditions to be applied to the distal second node(s) of the adjoining dummy device(s) 552-553 during a specific test, the specific parameter (e.g., off-state junction leakage current (Ixoff), off-state gate current (Igoff), on-state gate current (Igon), drain-to-substrate junction leakage current (Ijx), saturation threshold voltage (Vtsat), saturation drain current (Idsat), etc.) to be determined during that specific test is identified. Then, given the specific parameter at issue, the optimal first bias conditions for the first nodes of that selected test device are determined. Based on the optimal first bias conditions, optimal second bias conditions for all distal second nodes of all adjoining dummy devices (internal or external) that are directly electrically connected to the selected test device are determined. Specifically, the optimal second bias condition for the distal second node(s) of an adjoining dummy device, which has a proximal second node directly electrically connected to the selected test device at a specific first node, will be equal to the first biasing condition that was previously determined for the specific first node. For example, consider an adjoining dummy device with a proximal second node directly electrically connected to a specific first node of a test device. If the specific first node of the test device is to be biased at Vdd, then any distal second node(s) of the adjoining dummy device should also be biased to Vdd. Contrarily, if the specific first node of the test device is to be biased at ground (i.e., 0V), then any distal second node(s) of the adjoining dummy device should also be biased to ground.

It should be noted that, optionally, each distal second node of an adjoining dummy device 552 or 553 can be electrically connected to a corresponding input/output pad. That is, none of the distal second nodes would share an input/output pad. Such a configuration would allow for the highest degree of measurement accuracy, would minimize undesired current paths, and would enable post measurement calibration by eliminating floating nodes. However, such a configuration would require a large number of input/output pads and could lead to an undesirable increase in the size of the test structure 500 over currently available test structures.

Therefore, optionally, in order to minimize any size increase the test structure 500 relative to currently available test structures, the number of overall number of input/output pads connected to the various nodes can be limited by connecting two or more nodes of the test devices 551 and/or the adjoining dummy devices 552-553 to a shared input/output pad. For example, two or more of the first nodes of the test devices 551 in the first test section 511 of the first test component 510 can share an input/output pad (i.e., can be electrically connected to the same input/output pad). Additionally, two or more of the distal second nodes of the adjoining dummy devices 552-553 in the test sections 511-513 of the first test component 510 and/or in the second test component 520 can share an input/output pad.

In order to determine, which first nodes of the test devices 551 and which distal second nodes of the adjoining dummy devices 552-553 could potentially share an input/output pad, the following processes can be performed: (1) identify all of the nodes among the test components 510-520 and test sections thereof that are used for biasing only and not used for current/voltage measurement; (2) optimize the test sequence to maximize common bias conditions among the first nodes of the test devices 551 and among the distal second nodes of any adjoining dummy devices 552-553; (3) identify all groups of nodes that should or can receive the identical bias during all tests; and (4) connect input/output pads to groups of nodes such that all nodes connected to the same input/output pad will receive the same bias conditions for all tests. For example, one shared input/output pad can be connected to one group of nodes so that they will have common bias conditions for all tests; another shared input/output pad can be connected to another group of nodes so that they will have common bias conditions for all tests; and so on. Bias conditions may, however, vary from test to test and from group to group for one or more of the tests.

Preferably, all nodes that are connected to the same input/output pad will have the same optimal bias conditions for all tests.

In one exemplary embodiment, the test structure 500 can be limited to the twenty-five input/output pads P1-P25, which are shown in the schematic drawings of FIGS. 6-10 and listed in the table of FIG. 11.

Specifically, as indicated in these figures, input/output pads P1-P7 can be associated specifically with the first test component 510. For example, input/output pad P1 can be a shared input/output pad electrically connected to the gates of the test devices PG-L and PG-R in the first test section 511 of the first test component 510. Input/output pad P2 can be a shared input/output pad electrically connected to the sources of the test devices 551 PG-L and PG-R in the first test section 511 of the first test component 510. Input/output pad P3 can be a shared input/output pad electrically connected to the drains of the test devices 551 PG-L and PG-R in the first test section 511 and the drains of the test devices 551 PD-L and PD-R in the third test section 513. Input/output pad P4 can be a shared input/output pad electrically connected to the sources of the test devices 551 PD-L and PD-R in the third test section 513. Input/output pad P5 can be a shared input/output pad electrically connected to the drains of the test devices PU-L and PU-R in the second test section 512. Input/output pad P6 can be a shared input/output pad electrically connected to the gates of the test devices PU-L and PU-R in the second test section 512 and to the gates of the test devices PD-L and PD-R in the third test section 513. Input/output pad P7 can be a shared input/output pad electrically connected to the sources of the test devices PU-L and PU-R in the second test section 512.

Also, as indicated in these figures, input/output pads P11-P19 can be associated with the second test component 520 and input/output pads P20-P24 can be associated specifically with the third test component 530.

Additionally, as indicated in the figures, a limited number of input/output pads can be used to enable biasing of the distal second nodes of all of the adjoining dummy devices 552-553 in the test structure 500. For example, a pair of shared input/output pads P8 and P9 can be used. Specifically, input/output pad P8 can be a shared input/output pad connected to a first group of distal second nodes of a first group of adjoining dummy devices so that these nodes will have common bias conditions (i.e., the same bias conditions) for all tests. Input/output pad P9 can also be another shared input/output pad connected to a second group of distal second nodes of adjoining dummy devices so that these nodes will have common bias conditions for all tests. Since the first group and second group are electrically connected to different input/output pads, these two groups can have different bias conditions for one or more of the tests.

FIGS. 12A-12B are tables associating the different first nodes of the test devices 551 in the first test component 510 and in the second test component 520 with specific input/output pads and the various bias conditions applied by those specific input/output pads to the nodes during different tests.

Specifically, the table of FIG. 12A associates the first nodes of the test devices 551 in the test sections 511-513 of the first test component 510 with input/output pads (P1-P7) and further indicates exemplary first bias conditions to be applied through each of the input/output pads (P1-P7) to the first nodes during various different tests (e.g., tests performed to determine parameters, such as off-state junction leakage current (Ixoff), off-state gate current (Igoff), on-state gate current (Igon) and drain-to-substrate junction leakage current (Ijx)).

The table of FIG. 12B associates the first nodes of the test device 551 in the second test component 520 with input/output pads (P11-P19) and further indicates exemplary first bias conditions to be applied through each of the input/output pads P11-P19 to the first nodes during various different tests (e.g., tests performed to determine parameters, such as saturation threshold voltage (Vtsat) and saturation drain current (Idsat)).

The tables of FIGS. 12A and 12B also identify the pair of shared input/output pads P8 and P9, which enable biasing of the distal second nodes of all of the adjoining dummy devices during tests, and further indicate the exemplary second bias conditions to be applied through the input/output pads P8 and P9 to the distal second nodes of the adjoining dummy devices during each of the above-mentioned tests (e.g., the tests performed using the first test component 510 to determine parameters, such as off-state junction leakage current (Ixoff), off-state gate current (Igoff), on-state gate current (Igon) and drain-to-substrate junction leakage current (Ijx), as well as tests performed using the second test component 520 to determine saturation threshold voltage (Vtsat) and saturation drain current (Idsat)).

It should be noted that, as mentioned above, the bias conditions for all distal second nodes of adjoining dummy devices connected to the same input/output pad (e.g., P8 or P9) will be the same for all tests. However, a trade-off can be made between increasing the number of input/output pads required for the test structure 500 and what bias conditions are used on the distal second nodes. For example, the optimal second bias conditions for a group of distal second nodes of adjoining dummy devices connected to a shared input/output pad may be the same for most, but not necessarily all, tests. In this case, calibration of the measured data can be performed post-test based on the actual bias conditions applied in order to get an accurate result. That is, if the optimal second bias conditions for a group of distal second nodes are the same for most tests, but a specific distal second node has a different optimal second bias condition than the other distal second nodes in the group for a given test, the group can still be electrically connected to the same input/output pad. While using a non-optimal bias condition for a given test is not ideal, the specific distal second node will still be biased and, thus, random accumulation of potential on that specific distal second node will be avoided. Thus, the actual potential on the specific distal second node can be accurately estimated and used to calculate the parameter at issue.

Figure 13:
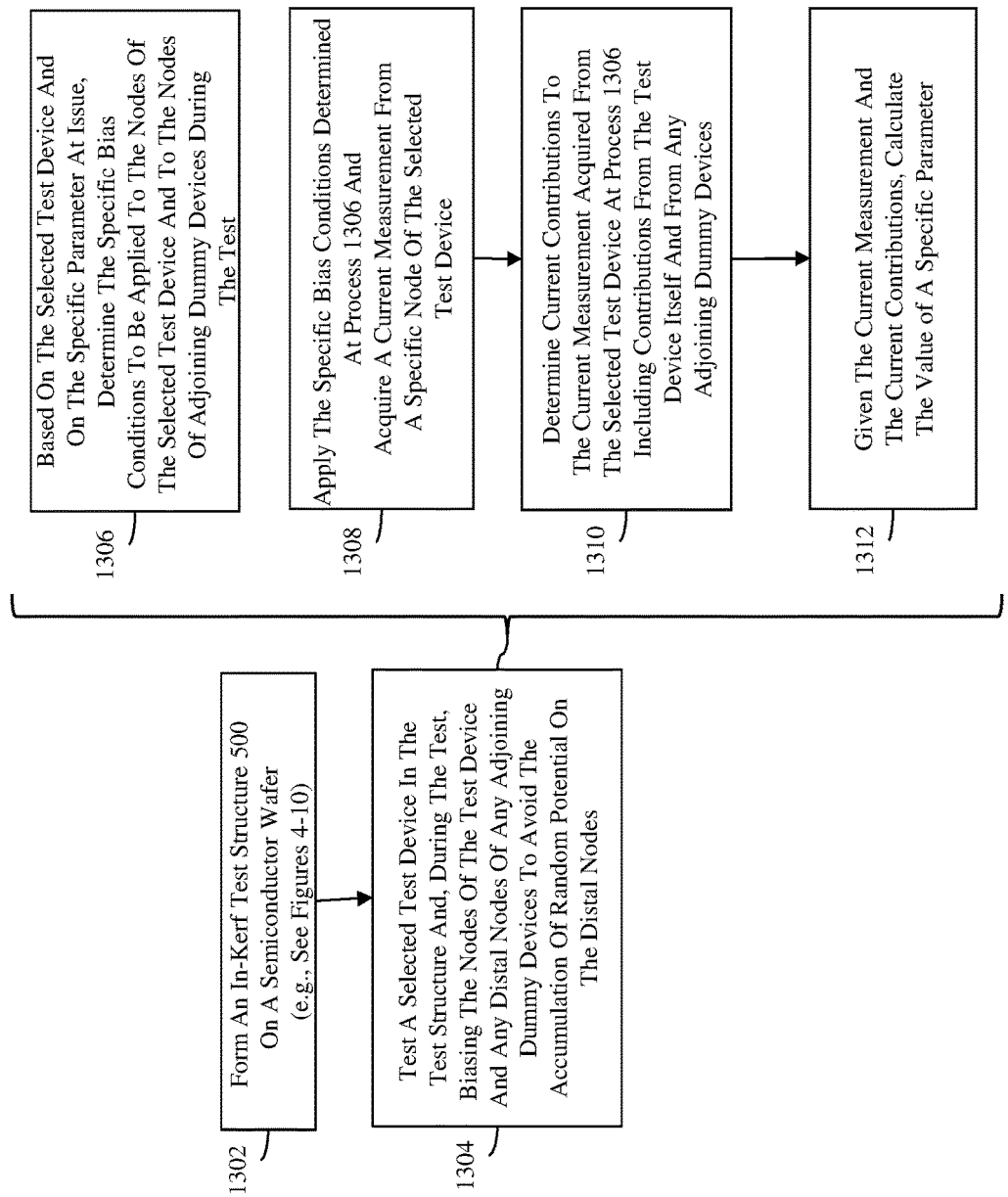
FIG. 13 is a flow diagram illustrating a testing method for testing an on-chip memory array (e.g., a static random access memory (SRAM) array) using an in-kerf test structure.

Referring to the flow diagram of FIG. 13, also disclosed herein is a testing method for testing an on-chip memory array (e.g., a static random access memory (SRAM) array) using an in-kerf test structure. Specifically, the method includes forming a test structure on a semiconductor wafer (1302). For example, a test structure 500, such as that described in detail above and illustrated in FIGS. 4-10 can be formed in a kerf region 420 of a semiconductor wafer adjacent to integrated circuit (IC) chip regions 410.

The method can further include testing a selected test device 551 within the test structure 500 (1304). During the testing of the selected test device, the input/output pads P1-P25 can be used to bias the first nodes of the selected test device 551 and each distal second node of any of the adjoining dummy devices 552 and/or 553 that are directly connected to the selected test device 551. By biasing the distal second node(s) of an adjoining dummy device, random accumulation of potential on the distal second node(s) of that adjoining dummy device is avoided. Thus, any current contributions from the adjoining dummy device(s) to a current measurement taken from the selected test device during testing can be accurately determined. As a result, any current parameter value that is determined for the selected test device based on the current measurement will, in turn, be accurate.

Specifically, as discussed in detail above with regard to the configuration of the test structure 500 and as indicated in the tables of FIGS. 11, 12A and 12B, the specific bias conditions to be applied to the different first nodes of a selected test device and to the distal second nodes of any adjoining dummy devices during a specific test can be determined based upon the specific parameter at issue (e.g., off-state junction leakage current (Ixoff), off-state gate current (Igoff), on-state gate current (Igon), drain-to-substrate junction leakage current (Ijx), saturation threshold voltage (Vtsat) or saturation drain current (Idsat)) (1306). Then during performance of the specific test, a current measurement can be acquired from a specific first node of the selected test device (1308). Current contributions to that current measurement from the selected test device itself as well as from the adjoining dummy device(s) can then be determined (1310). It should be noted that these current contributions can be determined because the accumulation of random potential on the distal second nodes of the adjoining dummy devices has been avoided by biasing those nodes. In any case, once the various current contributions from the adjoining dummy devices have been determined, the specific parameter at issue for the selected test device can be calculated based on both the current measurement taken at the specific first node and on the current contributions from the adjoining dummy devices (1312).

For example, referring to the schematic diagram of FIG. 6 illustrating the first test section 511 of the first test component 510. As discussed in detail above with regard to the test structure 500, this first test section 511 is configured for PG NFET parameter characterization. The first test section 511 includes test devices 551 and, particularly, a PG-L and a PG-R within a first instance of an SRAM cell 550. This first test section 511 further includes internal adjoining dummy devices 552 and, particularly, PU-L, PU-R, PD-L, and PD-R within the first instance of the SRAM cell 550 and external adjoining dummy devices 553 and, particularly, ePG-L1, ePG-L2, ePG-R1, and ePG-R2, outside of the first instance of the SRAM cell 550.

Consider PG-L as the selected test device 551 and the off-state junction leakage current (Ixoff) as the specific parameter at issue.

The first nodes of PG-L are as follows: the gate, which is electrically connected to P1; the source, which is electrically connected to P2; and the drain, which is electrically connected to P3.

The table of FIG. 12A can be referenced to determine the appropriate biasing conditions to be applied by the input/output pads when a current measurement necessary to determine Ixoff is taken. Specifically, in order to determine Ixoff, current (I) can be measured at P2 (i.e., the source of PG-L) when the first nodes of PG-L are biased as follows: Vgate biased to 0V by P1, Vdrain biased to Vdd by P3, and Vsource biased to Vdd by P2; when P8 is set at Vdd; and P9 is set at 0V. Since P2 is also connected to the drain of an external adjoining dummy device (ePG-L2), then the measured value of I at P2 will include current contributions, not only from PG-L, but also from ePG-L2. That is, the measured value of I at P2 will include the following current contributions: from PG-L, Ixoff and the off-state gate current (Igoff); and, from ePG-L2, the drain-to-substrate junction leakage current (Ijx), the off-state gate current (Igoff), the gate-induced drain leakage current (Igidl), and the off-state source current (Isoff). Additionally, since both the G and S nodes of ePG-L2 are biased by P8 and, thus, will be known, Igoff, Igidl, and Isoff for the ePG-L can be estimated with certainty. More specifically, I at P2 will include the following current contributions from both PG-L and from ePG-L2:

$$I(\text{at } P2) = I\text{xoff}(PG\text{-}L) + I\text{goff}(PG\text{-}L) + I\text{jx}(ePG\text{-}L2). \qquad (1)$$

Since both PG-L and ePG-L2 are essentially the same (e.g., have essentially the same configuration, the same dimensions, same dopant concentrations, etc.), Ijx(ePG-L2) can be safely approximated to Ijx(PG-L), yielding the following:

$$I(\text{at } P2) = I\text{xoff}(PG\text{-}L) + I\text{goff}(PG\text{-}L) + I\text{jx}(PG\text{-}L). \qquad (2)$$

Therefore, to determine Ixoff (PG-L) based on I (at P2), the values of the current contributions from both Igoff (PG-L) and Ijx (PG-L) must next be determined.

The table of FIG. 12A can again be referenced to determine the appropriate biasing conditions to be applied by the input/output pads when a current measurement necessary to determine Igoff is taken. Specifically, in order to determine the specific parameter of Igoff for the test device PG-L, current (I) can be measured at P1, when the first nodes of PG-L are biased as follows: Vgate biased to 0V by P1, Vdrain biased to 0V by P3, Vsource biased to Vdd by P2; when P8 is set at 0V and when P9 is also set at 0V. As a result, I at P1 will have the following components:

$$I(\text{at } P1) = I\text{goff}(PG\text{-}L) + I\text{goff}(PG\text{-}R). \qquad (3)$$

Since PG-L and PG-R are essentially the same (e.g., will have essentially the same configuration, the same dimensions, same dopant concentrations, etc.) and have the same bias conditions, Igoff (PG-L) can be determined as follows:

$$I\text{goff}(PG\text{-}L) = I(\text{at } P1)/2. \qquad (4)$$

It should be noted that, since the source and drains of ePG-L1 are biased by P9 to 0V when the parameter is Igoff is to be determined, leakage current flowing through ePG-L1 and ePG-R1 will be prevented.

The table of FIG. 12A can again be referenced to determine the appropriate biasing conditions to be applied by the input/output pads when a current measurement necessary to determine Ijx is taken. Specifically, in order to determine the specific parameter of Ijx for the test device PG-L, current (I) is again measured at P2 (i.e., I at P2'), when the nodes of PG-L are biased as follows: Vgate biased to Vdd by P1, Vdrain biased to Vdd by P3, Vsource biased to Vdd by P2; when P8 is set to Vdd; and when P9 is set to Vdd. As a result, I at P2' will have have following components:

$$I(\text{at } P2') = I\text{jx}(ePG\text{-}L2) + I\text{jx}(ePG\text{-}R2) \qquad (5)$$

Since PG-L, ePG-L2, and ePG-R2 are all essentially the same (e.g., will have essentially the same configuration, the same dimensions, same dopant concentrations, etc.) with the same bias conditions, Ijx(PG-L) can be determined as follows:

$$I\text{jx}(PG\text{-}L) = I(\text{at } P2')/2. \qquad (6)$$

Finally, given the known current value of Ijx (PG-L) determined using equation (6) above and the known current value of Igoff (PG-L) determined using equation (4) above, Ixoff can be accurately determined, as follows, using equation (2) above:

$$I\text{xoff}(PG\text{-}L) = I(\text{at } P2) - I\text{goff}(PG\text{-}L) - I\text{jx}(PG\text{-}L). \qquad (7)$$

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a semiconductor wafer; and,
a test structure on the semiconductor wafer, wherein the test structure comprises:
a test component comprising:
at least one test device comprising first nodes; and
adjoining dummy devices, wherein each adjoining dummy device comprises second nodes comprising at least one proximal second node that is directly connected to a first node of the at least one test device and at least one distal second node; and
input/output pads that are electrically connected to the first nodes of the at least one test device and to the at least one distal second node of each of the adjoining dummy devices,
wherein the input/output pads allow biasing of the first nodes of the at least one test device and the at least one distal second node of each of the adjoining dummy devices during testing,
wherein the input/output pads comprise at least two shared input/output pads,
wherein the shared input/output pads comprise a pair of shared input/output pads to allow biasing of all distal second nodes of all the adjoining dummy devices, and
wherein the test structure is within a kerf region of the semiconductor wafer.

2. The semiconductor structure of claim 1, wherein biasing distal second nodes of the adjoining dummy devices prevents random accumulation of potential on the distal second nodes.

3. The semiconductor structure of claim 1, wherein each shared input/output pad is electrically connected to a group of nodes having common bias conditions for all tests.

4. A semiconductor structure comprising:
a semiconductor wafer; and,
a test structure on the semiconductor wafer,
wherein the test structure comprises:
a test component for characterization of parameters of three different types of field effect transistors, respectively, within a static random access memory cell of a static random access memory array, wherein the test component comprises three sections including a first section, a second section and a third section and wherein each of the three sections comprises:
multiple test devices within a static random access memory cell, wherein each test device comprises first nodes; and
adjoining dummy devices, wherein each adjoining dummy device comprises second nodes, comprising a proximal second node that is directly connected to a first node of a test device of the multiple test devices and at least one distal second node, wherein the test devices in the first section comprise pass gate field effect transistors, the test devices in the second section comprise pull up field effect transistors, and the test devices in the third section comprise pull down field effect transistors; and
input/output pads that are electrically connected to the first nodes of each test device in each section and to the at least one distal second node of each adjoining dummy device in each section,
wherein the input/output pads allow biasing of the first nodes of a selected test device of the test devices and each distal second node of any adjoining dummy devices during testing,
wherein the input/output pads comprise at least two shared input/output pads, and
wherein the shared input/output pads comprise a pair of shared input/output pads to allow biasing of all distal second nodes of all the adjoining dummy devices.

5. The semiconductor structure of claim 4, wherein biasing distal second nodes of the adjoining dummy devices prevents random accumulation of potential on the distal second nodes.

6. The semiconductor structure of claim 4, wherein each shared input/output pad is electrically connected to a group of nodes having common bias conditions for all tests.

7. The semiconductor structure of claim 4, the test structure further comprising a second test component for characterization of parameters of the static random access memory cell and a third test component for characterization of static random access memory cell leakage.

* * * * *